May 31, 1960 L. M. KRUGMAN 2,939,000
FREQUENCY CONVERTER HAVING MEANS TO
PREVENT SELF-QUENCHING
Filed Oct. 3, 1957

INVENTOR.
LEONARD M. KRUGMAN
BY H. L. Newton
ATTORNEY 2,939,000

FREQUENCY CONVERTER HAVING MEANS TO PREVENT SELF-QUENCHING

Leonard M. Krugman, Collingswood, N.J., assignor to Radio Corporation of America, a corporation of Delaware Filed Oct. 3, 1957, Ser. No. 688,055

10 Claims. (Cl. 250—20)

Figure 1:
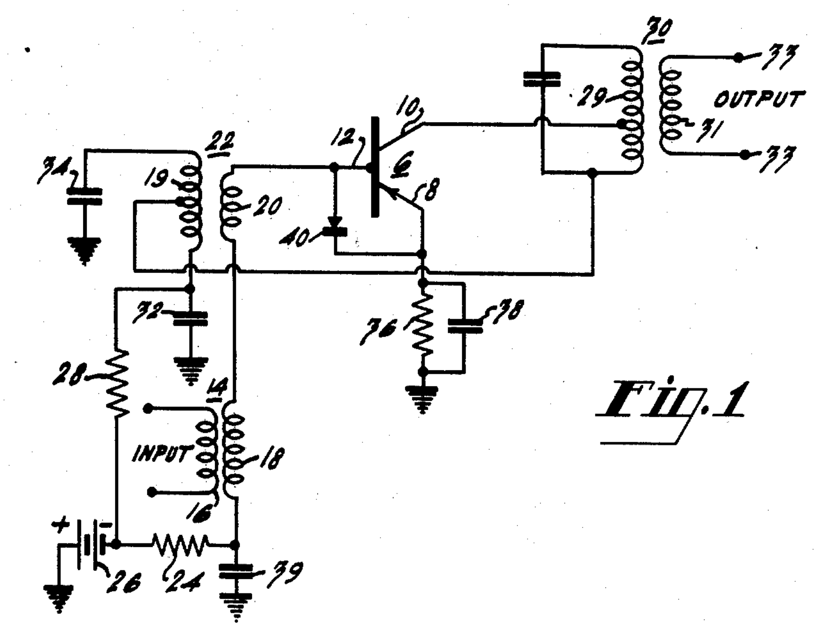

This invention relates to frequency converter circuits and in particular to frequency converter circuits utilizing transistors as active amplifying elements.

One of the difficulties encountered in the design of transistor frequency converters is their tendency to self-quench when the amplitude of the injected oscillator signal becomes excessive. This condition may result, for example, when transistors of relatively wide tolerance range are interchanged in the converter circuit. The converter circuit may operate satisfactorily with a certain type of transistor which is within a normal tolerance range of variation in operating characteristics, but will self-quench when another transistor of the same type, but with different operating characteristics within such tolearance range is substituted in the circuit. The converter circuit will be less expensive to manufacture if it can be made to operate satisfactorily with transistors having operating characteristics which embrace a relatively wide tolerance range.

It is, accordingly, an object of this invention to provide an improved transistor frequency converter circuit in which self-quenching is eliminated despite the interchange of wide tolerance range transistors in the circuit.

To provide effective gain control of receiving systems, it is generally considered desirable to control the gain of the converter stage. The main objection to applying gain control a transistor converter is that the gain control decreases the oscillator injection voltage as the bias current of the transistor is varied. This causes injection cut-off before appreciable gain control is obtained.

It is therefore another object of this invention to provide an improved transistor frequency converter circuit to which a gain control signal can be applied without adversely affecting the circuit operation.

A frequency converter circuit embodying the invention includes a transistor having input, output, and common electrodes which may be the base, collector, and emitter electrodes, respectively. The transistor is connected in the circuit to provide sustained oscillations and includes an injection feedback circuit coupled between the output and input electrodes for applying an oscillator signal to the input electrode. To prevent self-quenching of the transistor despite the injection of relatively large amplitude oscillator signals, a variable impedance element such as a normally reverse-biased diode is direct-current conductively connected between the input and common electrodes. The diode maintains a forward bias between the input and common electrodes over a wide amplitude range of oscillator signals and permits the application of a gain control signal to the converter transistor.

Figure 2:
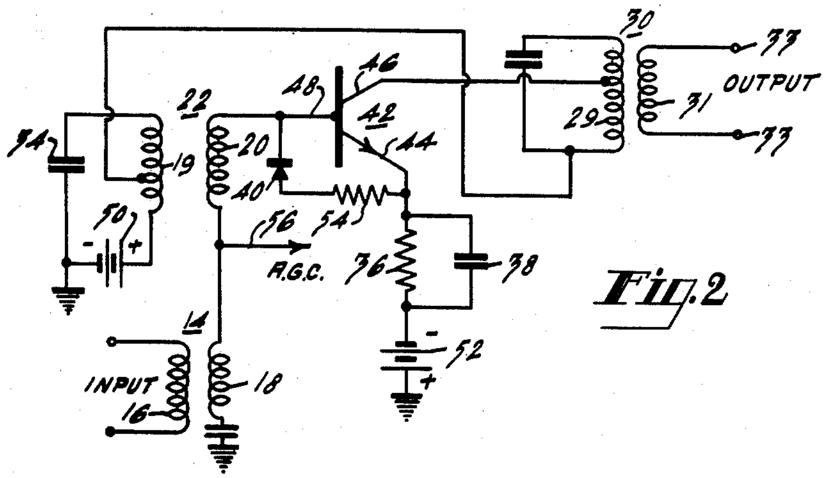

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a transistor frequency converter circuit embodying the invention in which a transistor of N type conductivity is used as the active signal amplifying element; and Figure 2 is a schematic circuit diagram of a transistor frequency converter circuit embodying the invention in which a transistor of P type conductivy is used as the active amplifying element.

Referring now to the drawing wherein like parts are indicated by like reference numerals in both figures, and referring particularly to Figure 1, a frequency converter circuit includes a transistor 6 which may be considered to be a P–N–P junction tranistor and which includes emitter 8, collector 10, and base 12 electrodes. Received modulated signals such as from an antenna or from a radio frequency amplifier are applied to the input or base electrode 12 of the transistor 6 through a transformer 14 which includes a primary winding 16 and a secondary winding 18. One terminal of the secondary winding 18 is connected through the secondary winding 20 of an oscillator feedback coupling transformer 22 to the base 12 of the transistor 6. The transformer 22, which couples the oscillator feedback signal to the base 12, also includes a primary winding 19. The other terminal of the secondary winding 18 of the input transformer 14 is connected through a resistor 24 to the negative terminal of a direct-current biasing supply source or battery 26. This latter connection provides base bias for the transistor 6. A filter capacitor 39 is connected from the junction of resistor 24 and the secondary winding 18 to a point of reference potential in the circuit, such as ground. The negative terminal of the battery 26 is also connected through a resistor 28, a portion of the primary winding 19, and a portion of the primary winding 29 of an output transformer 30 to the collector 10. The transformer 30 also includes a secondary winding 31 having a pair of output terminals 33. A filter capacitor 32 is connected from the junction of the resistor 28 and the primary winding 19 to a point of reference potential in the circuit. An oscillator tuning capacitor 34 is connected between the primary winding 19 and ground. To provide negative current feedback stabilization for the transistor 6, the emitter 8 is connected to ground through a degenerative stabilizing resistor 36. The stabilizing resistor 36 is by-passed for signal frequencies by a by-pass capacitor 38.

To complete the circuit and to prevent self-quenching, in accordance with the invention, a variable impedance device such as a diode 40 is direct-current conductively connected between the input or base electrode 12 and the common or emitter electrode 8 of the converter transistor 6. The diode 40 is poled in the circuit for forward conduction in the same direction as normal direct base-emitter current flow of the transistor 6 and is normally reverse biased. This reverse bias is provided by the connection of the anode of the diode 40 through the secondary windings 20 and 18 and the resistor 24 to the negative terminal of the battery 26.

In operation, the output signal developed in the output or collector electrode circuit of the transistor 6 is fed back through the transformer 22 to the base 12. The phase and amplitude of the signal so fed back is sufficient to maintain sustained oscillation of the oscillator circuit. The received modulated signal is applied through the input transformer 14 to the base 12 and is heterodyned or mixed with the oscillator signal by the transistor 6, and a signal at an intermediate frequency is developed in the collector circuit of the converter transistor. This intermediate frequency signal may be derived from the terminals 33 of the secondary winding 31 of the output transformer 30.

Normally, that is without the diode 40 connected in the circuit, a direct voltage is established across the emitter resistor-capacitor stabilizing circuit of the transistor 6 due to the non-linearity of the base-emitter diode of the transistor 6. This direct-current voltage is proportional to the amplitude of the injected oscillator voltage, and will increase as the amplitude of the negative half-cycles of the oscillator signal, which is applied to the base 12 through the transformer 22 increase. The polarity of the direct voltage which is established across the emitter R-C stabilizing network is opposite to the normal forward emitter-base bias voltage of the transistor 6. Thus an increase in the amplitude of the injected oscillator signal causes the emitter 8 to become less positive relative to the base 12 which decreases the forward emitter-base bias of the transistor 6 and eventually cause reverse base-emitter bias. By reducing the forward emitter-base bias of the transistor 6 its gain will decrease. If the amplitude of the injected oscillator voltage is large, the gain of the transistor 6 is insufficient to maintain oscillations. When oscillations cease due to the reverse emitter-base bias, the charge on the capacitor 38 of the emitter stabilizing circuit begins to leak off through the emitter stabilizing resistor 36. Eventually, forward base-emitter bias will be re-established and oscillation will start again. This cycle repeats in the absence of the diode 40 in the circuit and is, of course, undesirable.

The diode 40 prevents, in accordance with the invention, the self-quenching action described above. Normally, that is when the oscillator injection voltage is not large enough to cause self-quenching, the diode 40 is reverse biased and has no effect on the injected oscillator signal. When the amplitude of the oscillator injection voltage increases, however, the diode becomes forward biased as the voltage across the emitter R-C stabilizing network becomes more negative. That is, the cathode of the diode 40 will become more negative than the anode. Thus the diode will conduct current in the forward direction. This forward current is in a direction opposite to the charging current of the capacitor 38. Accordingly, the conduction of the diode 40 in the forward direction will oppose the direct voltage across the emitter R-C stabilizing network and will prevent the emitter-base bias from reversing. Since the emitter-base bias of the transistor 6 remains in the forward direction despite increases in the amplitude of the oscillator injection voltage, the gain of the transistor 6 is sufficient to maintain oscillations and self-quenching will not take place.

Without the diode 40 connected in the circuit, and in accordance with usual design techniques, the converter circuit would be designed so that the injection voltage would not be large enough to cause self-quenching when high limit transistors are used. If the tolerance range of available transistors is large, therefore, low limit transistors would not operate or would at least tend to cut-off as the battery voltage decreased. In addition, the performance of the low limit transistors would not be satisfactory because of the low level of the injection voltage. Without the diode 40, therefore, the converter transistors must be preselected carefully and only those within a small tolerance range could be interchanged in the circuit. By connecting the normally reverse-biased diode 40 between the base and emitter electrodes in accordance with the invention, however, the tolerance range of the transistors which can be interchanged in the circuit is made almost indefinite. With the diode 40 in the circuit, the circuit designer may set the oscillator injection voltage to permit optimum performance with low limit transistors. In this way there will be no conversion loss due to a low amplitude injection voltage while using low limit transistors or by over-excitation of high limit transistors. Thus, maximum available gain of all transistors over a wide tolerance range is realized.

In addition to the foregoing advantages, the inclusion of the diode 40 permits the gain of the converter transistor to be more readily controlled. In ordinary converter circuits, application of gain control causes the injection voltage to decrease directly with a decrease in bias current. This causes injection cut-out before an appreciable amount of gain control can be obtained. By connecting the diode 40 in the circuit a higher oscillator injection voltage can be used, which permits the gain of the converter transistor to be controlled without injection cut-out. Another incidental advantage of the diode 40 is that it helps to eliminate strong signal overload of a receiver by shunting to ground received signals of the same order of amplitude as the reverse bias across the diode.

The following values may be assigned to the circuit components, by way of example only:

| | |
|---|---|
| Transistor 6 | Type 2N140. |
| Diode 40 | Type 1N295. |
| Battery 26 | 9 volts. |
| Resistors 24; 28; and 36 | 100,000; 470; and 3,900 ohms, respectively. |
| Capacitors 32; 38; and 39 | 0.1; .047; and 0.1 microfarads, respectively. |

In Figure 2, reference to which is now made, a transistor 42 of P type conductivity is used as the active element of the converter circuit. The transistor 42, which may be considered to be of the N-P-N type includes an emitter 44, a collector 46 and a base 48. Since the transistor 42 is of P type conductivity it requires a positive collector bias voltage. Accordingly, the collector 46 is connected through the primary winding 29 of the output transformer 30 to a tap on the primary winding 19 of the oscillator injection transformer 22, and to the positive terminal of battery 50, thus providing feedback between the collector 46 and the base 48 to sustain oscillation of the circuit and positive collector voltage bias. To provide a negative emitter bias voltage for the transistor 42 and reverse bias for the diode 40, the emitter 44 is connected through the emitter stabilizing resistor 36 to the negative terminal of a second battery 52, the positive terminal of which is connected to ground. The negative terminal of the battery 52 is also connected through the resistor 36 and a resistor 54 to the anode of the diode 40. The cathode of the diode 40 is connected directly with the base 48. The base 48 is returned to ground through the secondary winding 20 of the oscillator injection transformer 22 and the secondary winding 18 of the input transformer 14. The diode 40 is poled in the circuit for forward conduction in the same direction as normal emitter-base current flow of the transistor 42 and is biased in the reverse non-conducting direction by the battery 52. To provide automatic gain control of the transistor 42, an automatic gain control lead 56 is connected through the secondary winding 20 of the oscillator injection transformer 22 to the base 48. The lead 56, which may be connected to the detector of the receiver, becomes less positive as the signal strength increases thereby reducing the forward base-emitter bias of the transistor 42 and hence its gain. Since high values of oscillator injection voltage may be used because of the inclusion of the diode 40 in the circuit, application of the gain control voltage to the base 48 is possible without reducing the injection voltage to the point where injection cut-out occurs.

In operation, the circuit illustrated in Figure 2 is identical to the circuit in Figure 1 except that the polarity of the circuit voltages are reversed. Thus, this circuit, as well as the circuit illustrated in Figure 1, permits the interchange of transistors of a wide tolerance range in the converter circuit without the danger of self-quenching. Thus, circuits embodying the invention may be useful wherever there is a danger of self-quenching and particularly where wide operating tolerance ranges are desired for economic considerations.

What is claimed is:

1. A frequency converter circuit comprising in combination, a transistor including input, output, and common electrodes, means connecting said transistor in said circuit to provide sustained oscillation including an oscillator injection feedback circuit coupled between said output and input electrodes for applying an oscillator signal to said input electrode, means for applying an input signal between said input and common electrodes for heterodyning with said oscillator signal, means for deriving an intermediate frequency signal between said output and common electrodes, means providing a charging network including a capacitor connected between said input and common electrodes, and means for preventing self-quenching of said transistor for relatively large amplitude oscillator signals including a normally reverse biased diode direct-current conductively connected between said input and common electrodes.

2. A frequency converter circuit comprising in combination, a transistor including base, emitter, and collector electrodes, means connecting said transistor in said circuit to provide sustained oscillation including means for applying a feedback oscillator signal to said base electrode, means for applying an input signal between the base and emitter electrodes of said transistor for heterodyning with said oscillator signal to provide an intermediate frequency signal, means providing a biasing network including a capacitor connected between said base and emitter electrodes, and means for preventing self-quenching of said transistor for relatively large amplitude oscillator signals including a normally reverse-biased diode direct-current conductively connected between said base and emitter electrodes.

3. A frequency converter circuit for a radio receiver comprising, in combination, a transistor including base, emitter, and collector electrodes, means connecting said transistor in said circuit to provide sustained oscillation including regenerative feedback means coupled between said collector and base electrodes for applying a feedback oscillator signal to said base electrode, means for applying a received signal to said base electrode for heterodyning with said oscillator signal to develope an intermediate frequency signal, means for deriving said intermediate frequency signal from said collector electrode, a resistance-capacitance stablizing circuit connected with said emitter electrode for stabilizing the circuit operation of said transistor, and a normally reverse biased diode connected between said base and emitter electrodes for preventing signal-induced reverse bias for said transistor across said stabilizing circuit and for maintaining a forward emitter-base bias voltage over a relatively wide amplitude range of oscillator signals.

4. A frequency converter circuit comprising in combination, a transistor including input, output, and common electrodes, means connecting said transistor in said circuit to provide sustained oscillation including an oscillator injection feedback circuit coupled between said output and input electrodes for applying an oscillator signal to said input electrode, means for applying an input signal between said input and common electrodes for heterodyning with said oscillator signal, means for deriving an intermediate frequency signal between said output and common electrodes, means providing a charging network including a capacitor connected between said input and common electrodes, means for preventing self-quenching of said transistor for injected oscillator signals above a predetermined amplitude including a diode direct-current conductively connected between said input and common electrodes, and direct-current bias supply means connected in said circuit to provide energizing voltages for said transistor and with said diode for applying reverse bias thereto for injected oscillator signals below said predetermined amplitude.

5. A frequency converter circuit comprising in combination, a transistor including an input and an output circuit means connecting said converter circuit to develop an oscillator signal for heterodyning with a received signal applied to said input circuit, means providing a resistance-capacitance network in series with said input circuit for developing a bias voltage for said transistor, and means for preventing self-quenching of said transistor for relatively large amplitude oscillator signals including a variable impedance diode element connected with said transistor to maintain a forward bias condition of said input circuit over a wide amplitude range of oscillator signals.

6. A frequency converter circuit comprising in combination, a transistor including base, emitter, and collector electrodes, means connecting said transistor in said circuit to provide sustained oscillation including means for applying a feedback oscillator signal to said base electrode from said collector electrode, means for applying an input signal to the base electrode said transistor for heterodyning with said oscillator signal to provide an intermediate frequency, means providing a self-bias network including a capacitor connected between said base and emitter electrodes, means for preventing self-quenching of said transistor for relatively large amplitude oscillator signals including a diode direct-current conductively connected between said base and emitter electrodes, and means providing a direct-current bias supply connected with said transistor for applying energizing voltages thereto and with said diode for applying reverse bias thereto for relatively low amplitude oscillator signals.

7. A frequency converter circuit comprising in combination, a transistor including base, collector, and emitter electrodes, means connecting said transistor in said circuit to provide sustained oscillation including an oscillator injection feedback circuit coupled between said collector and base electrodes for applying an oscillator signal to said base electrode from said collector electrode, means for applying an input signal between said base and emitter electrodes for heterodyning with said oscillator signal, means for deriving an intermediate frequency signal between said collector and emitter electrodes, means providing a biasing circuit connected between said base and emitter electrodes for developing a direct current voltage which is a function of the amplitude of signals applied between said emitter and base electrodes, and means for preventing self-quenching of said transistor for relatively large amplitude oscillator signals including a normally reverse-biased diode direct-current conductively connected between said base and emitter electrodes and poled for forward conduction in the opposite direction to normal base-emitter current flow as measured from the base of said transistor.

8. A frequency converter circuit comprising in combination, a transistor including input, output, and common electrodes, means connecting said transistor in said circuit to develop an oscillator signal for heterodyning with a received signal applied between said input and common electrodes, means providing a circuit connected between said input and common electrodes for developing a direct current bias voltage the amplitude of which is a function of the amplitude of signals applied between said input and common electrodes, and means for preventing self-quenching of said transistor for relatively large amplitude oscillator signals including a variable impedance diode element connected between said input and common electrodes for maintaining a forward bias voltage therebetween over a wide amplitude range of oscillator signals.

9. A frequency converter circuit for a radio receiver comprising, in combination, a transistor including base, input, emitter common, and collector output electrodes, means connecting said transistor in said circuit to provide sustained oscillation including regenerative feedback means coupled between said collector and base electrodes for applying a feedback oscillator signal to said base electrode from said collector electrode, input circuit means connected for applying a received signal to said base electrode for heterodyning with said oscillator signal to develop an intermediate frequency signal, output circuit means connected for deriving said intermediate frequency signal from said collector electrode, direct-current supply means connected to provide a forward-bias voltage between said emitter and base electrodes and a reverse-bias voltage between said collector and base electrodes, negative current feedback means including a degenerative stabilizing resistor connected with said emitter electrode, a signal by-pass capacitor connected in parallel with said resistor, a diode connected between said base electrode and the junction of said resistor and said emitter electrode, and means connecting said source with said diode for applying a reverse bias voltage thereto for oscillator signals below a predetermined amplitude, said diode providing a high impedance in said circuit for oscillator signals below said predetermined amplitude and a low impedance for oscillator signals above said predetermined amplitude to prevent the development of reverse emitter-base bias across said resistor and capacitor and self-quenching operation of said converter circuit despite the interchange of wide tolerance range transistors in said circuit.

10. A frequency converter circuit comprising in combination, a transistor including base, emitter, and collector electrodes, means connecting said transistor in said circuit to provide sustained oscillation including means for applying a feedback oscillator signal to said base electrode, means for applying an input signal to said transistor for heterodyning with said oscillator signal to provide an intermediate frequency signal, means in series with said input signal means providing a bias circuit for developing a direct current bias voltage the amplitude of which is a function of the amplitude of signals applied between said emitter and base electrodes, and means for preventing self-quenching of said transistor for relatively large amplitude oscillator signals including variable impedance means direct current conductively connected between said base and emitter electrodes to provide a high impedance therebetween for oscillator signals below a predetermined amplitude and a low impedance therebetween for oscillator signals above said predetermined amplitude.

References Cited in the file of this patent

UNITED STATES PATENTS

| | | |
|---|---|---|
| 2,742,571 | Herzog | Apr. 17, 1956 |
| 2,750,507 | Law et al. | June 12, 1956 |
| 2,757,287 | Stanley | July 31, 1956 |
| 2,801,338 | Keller | July 30, 1957 |
| 2,802,071 | Lin | Aug. 6, 1957 |
| 2,825,810 | Zeidler | Mar. 4, 1958 |
| 2,849,611 | Adams | Aug. 26, 1958 |